US011475378B2

(12) United States Patent
Rommelfanger

(10) Patent No.: US 11,475,378 B2
(45) Date of Patent: Oct. 18, 2022

(54) PROJECT PLANNING SYSTEM, CONTROL PROGRAM AND METHOD FOR CHECKING CONSISTENT RECORDING OF PIPELINES IN A PROJECT PLANNING SYSTEM

(71) Applicant: Siemens Aktiengesellschaft, Munich (DE)

(72) Inventor: Rainer Rommelfanger, Trier (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/427,947

(22) PCT Filed: Jan. 7, 2020

(86) PCT No.: PCT/EP2020/050165
§ 371 (c)(1),
(2) Date: Aug. 3, 2021

(87) PCT Pub. No.: WO2020/160855
PCT Pub. Date: Aug. 13, 2020

(65) Prior Publication Data
US 2022/0101226 A1 Mar. 31, 2022

(30) Foreign Application Priority Data
Feb. 4, 2019 (EP) ..................... 19155284

(51) Int. Cl.
*G06F 30/18* (2020.01)
*G06Q 10/06* (2012.01)
(Continued)

(52) U.S. Cl.
CPC . *G06Q 10/06313* (2013.01); *G05B 19/41865* (2013.01); *G06F 30/18* (2020.01);
(Continued)

(58) Field of Classification Search
CPC . G06Q 10/06313; G06F 30/18; G06F 16/289; G05B 19/41865; G05B 19/0426;
(Continued)

(56) References Cited

U.S. PATENT DOCUMENTS 5,740,341 A * 4/1998 Oota ...................... G06Q 10/06
345/420
6,063,128 A 5/2000 Bentley et al.
(Continued)

FOREIGN PATENT DOCUMENTS

EP 1166215 1/2002
EP 2587329 5/2013
(Continued)

OTHER PUBLICATIONS

International Search Report dated Jan. 7, 2020 based on PCT/EP2020/050165 filed Jan. 7, 2020.

*Primary Examiner* — Kibrom K Gebresilassie
(74) *Attorney, Agent, or Firm* — Cozen O'Connor

(57) ABSTRACT

A method for checking consistent recording of pipelines recorded two-dimensionally in a first plan and three-dimensionally in a second plan, wherein a main path within each plan is determined for pipelines recorded in both plans, within both plans, objects having sequences of line components, branches and/or connections are determined for the recorded main paths, where objects without mutual correspondence that are recorded only in one of the two plans or only in a main path of one of the two plans are each eliminated from sequences to be compared, where within the sequences to be compared, objects having a different order which, with regard to their order within the sequences to be compared, have a maximum order difference, are subsequently determined and classified iteratively, where this is continued until the objects remaining after classification
(Continued)

have no order difference with regard to their order within the sequences to be compared.

15 Claims, 3 Drawing Sheets

(51) Int. Cl.
*G05B 19/418* (2006.01)
*G05B 19/042* (2006.01)
*G06F 16/28* (2019.01)

(52) U.S. Cl.
CPC ............ *G05B 19/0426* (2013.01); *G05B 2219/33148* (2013.01); *G06F 16/289* (2019.01); *Y02P 90/02* (2015.11); *Y02P 90/80* (2015.11)

(58) Field of Classification Search
CPC . G05B 2219/33148; Y02P 90/80; Y02P 90/02
See application file for complete search history.

(56) References Cited

U.S. PATENT DOCUMENTS

| | | | |
|---|---|---|---|
| 7,353,221 B1 | 4/2008 | Becker et al. | |
| 10,614,051 B2* | 4/2020 | Walbroel | G05B 19/0426 |
| 10,885,237 B2* | 1/2021 | Liu | G06T 19/00 |
| 2006/0247902 A1* | 11/2006 | Rourke | G06F 30/15 703/1 |
| 2007/0165035 A1* | 7/2007 | Duluk | G06T 15/20 345/506 |
| 2010/0094598 A1* | 4/2010 | Okada | G06T 17/10 703/1 |
| 2011/0040531 A1* | 2/2011 | Stolper | G06T 19/00 703/1 |
| 2013/0235041 A1 | 9/2013 | Bierweiler et al. | |
| 2014/0336785 A1* | 11/2014 | Asenjo | G05B 19/4185 700/17 |
| 2014/0336786 A1* | 11/2014 | Asenjo | G06F 3/048 700/17 |
| 2016/0274553 A1* | 9/2016 | Strohmenger | G05B 17/02 |
| 2016/0274978 A1* | 9/2016 | Strohmenger | G06F 11/1458 |
| 2018/0318899 A1* | 11/2018 | Byrd | B21D 7/12 |
| 2020/0004899 A1* | 1/2020 | Chastell | G06F 30/17 |
| 2020/0265121 A1* | 8/2020 | Myers | G06T 11/203 |

FOREIGN PATENT DOCUMENTS

| | | |
|---|---|---|
| EP | 2808749 | 12/2014 |
| EP | 3364257 | 8/2018 |
| WO | 2010037145 | 4/2010 |

* cited by examiner

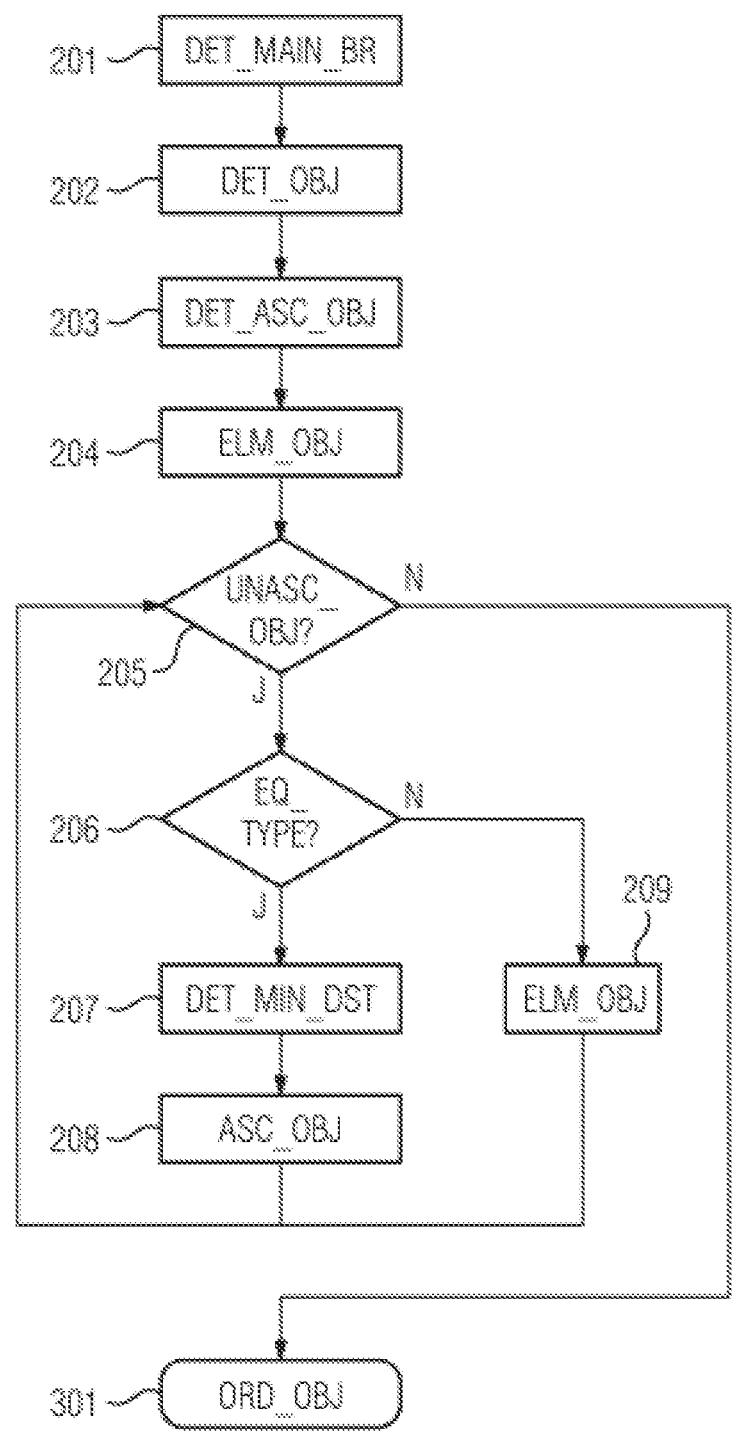

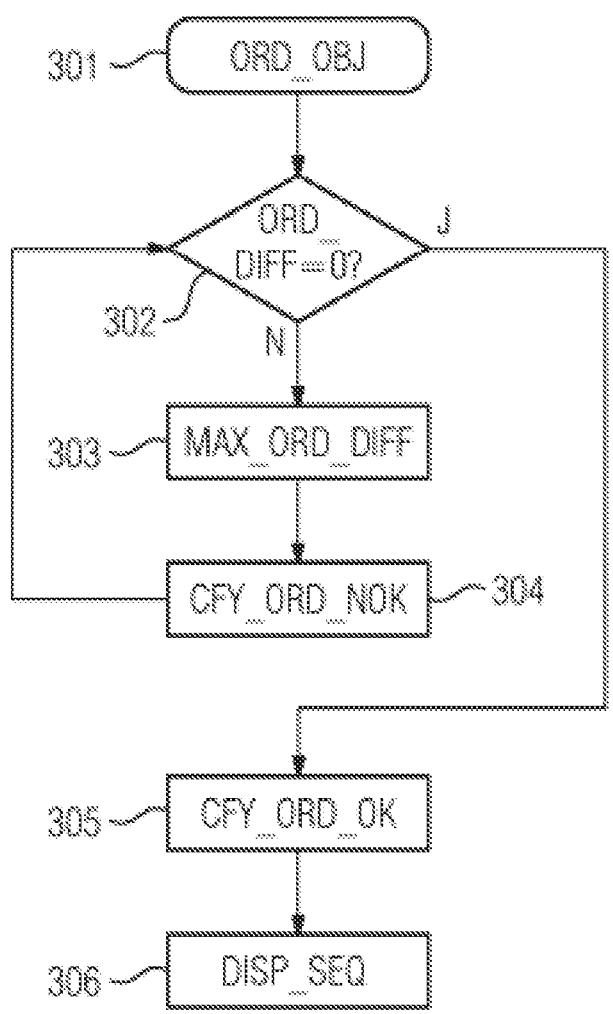

PROJECT PLANNING SYSTEM, CONTROL PROGRAM AND METHOD FOR CHECKING CONSISTENT RECORDING OF PIPELINES IN A PROJECT PLANNING SYSTEM

CROSS-REFERENCE TO RELATED APPLICATIONS

This is a U.S. national stage of application No. PCT/EP2020/050165 filed 7 Jan. 2020. Priority is claimed on European Application No. 19155284.3 filed 4 Feb. 2019, the content of which is incorporated herein by reference in its entirety.

BACKGROUND OF THE INVENTION

1. Field of the Invention

The invention relates to industrial process automation system and, more particularly to a project planning system, control program and method for checking consistent recording of pipelines in a project planning system

2. Description of the Related Art

Industrial automation systems are used for monitoring and open-loop and closed-loop control of technical processes, especially in the fields of manufacturing, process and building automation, and enable an essentially autonomous operation of control devices, sensors, machines and technical systems. An essential foundation for a reliable provision of monitoring, open-loop and closed-loop control functions via a process automation system consists in a complete and correct recording and modeling of components of the industrial process automation system in an engineering or project planning system.

An engineering system can be used in particular to develop control programs for automation devices, which are designed to visualize a model of a technical system or a complex machine and its open-loop or closed-loop control. At the run time of the control programs or during a runtime operation, a technical process is open-loop or closed-loop controlled by automation devices such as programmable logic controllers. As part of process monitoring during the run-time operation, an operator can call up process images to obtain an overview of a current system status and implement process management or operation.

EP 1 166 215 B1 describes a method for automatic recovery of engineering data of technical systems, in which engineering and runtime objects are described by a standard object model. This allows a direct correlation between engineering objects and runtime objects at the object level, such that no loss of information arises from a mapping of system components on to the object model. In addition, a direct communication can occur between engineering and runtime objects.

EP 2 808 749 B1 discloses a method for exchanging control information between operating and monitoring devices of an industrial automation system. On the basis of the control information, an at least partial model of a technical system controlled using automation devices is visualized on a graphical user interface of a respective control and monitoring device. The visualized model is assigned computer-based objects representing elements of the technical system, which are provided by a run-time environment configured on a respective control and monitoring device. All of the object types provided on different control and monitoring devices are made available in accordance with a standard addressing scheme for a device-independent access.

U.S. Pat. No. 6,063,128 relates to a system comprising a storage device, a first and second hardware or software platform, a persistent portable data model and computer-based modeling systems that are dependent on the first and second platform. Each platform has an interface to the storage device and provides system-dependent services. The first platform is assigned a first operating system type and a first computer hardware type, while the second platform is assigned a second operating system type as well as a second computer hardware-type. The portable data model is stored in the memory device in a platform-independent format and comprises persistent component objects. In addition, the computer-based modeling system for the first platform is stored in a first storage area of the memory device, while the computer-based modeling system for the second platform is stored in a second storage area of the memory device. Each computer-based modeling system provides services to retrieve the portable data model from the storage device, modify the data model by adding and removing component objects and store the data model persistently in the memory device. In addition, each computer-based modeling system comprises a static kernel and a dynamic software framework. The kernels run on the respective platform and form interfaces to the associated operating system and to the corresponding computer hardware. The software frameworks run on the respective platform, form interfaces to the associated kernel, and each provide a platform-independent graphical user interface.

WO 2010/037145 A2 discloses a method for managing a process controller in a computer system, which is designed for configuring and monitoring a process plant. The computer system provides an interactive user interface for managing a multiplicity of objects in the process plant. Each of these objects corresponds to the multiplicity of objects of a physical or logical unit in the process plant. It also creates a navigation panel for displaying a set of selectable elements. Each element in the set of selectable elements corresponds to a particular object from the multiplicity of objects. In addition, a command panel is created to display a set of selectable control elements. Each control element from the set of selectable control elements corresponds to a task that is to be performed on at least one object of the multiplicity of objects in the process plant. The navigation panel receives a selection of an element from the set of selectable elements, while the command panel receives a selection of a control element from the set of selectable control elements. An operational context is determined on the basis of the selection received. The operational context corresponds to a set of actions that are applicable to the selection if the selection is an element selection, or to a set of elements to which the selection is applicable if the selection is a control element selection. The navigation panel or the command panel is adjusted according to the operational context.

EP 3 364 257 A1 discloses an engineering system for an industrial process automation system, in which components of the industrial process automation system are each represented by a computer-based object and are persistently stored in at least one server-side database. Engineering objects specified by a user selection are loaded from the database into at least one processing memory area. If the client side initiates a user release of objects to be released that have been loaded into a selected processing memory area, a test is performed to determine whether an immediately higher-priority processing memory area is available. For releasable objects loaded into the selected processing memory area, upon a positive test result direct predecessors in the higher-priority processing memory area are identified and added to the releasable objects. From among the releasable objects, objects that are hierarchically subordinate to objects to be released are identified and tagged for release. The objects tagged for release are moved from the selected user storage area into the higher-priority user storage area by a change to their assignment.

US 2006/247902 A1 discloses a 3D-CAD method for routing pipes, ducts, supply lines and HVAC lines (heating, ventilation and cooling). The method combines router software for 2D real-time applications and a graphical user interface to create an editing environment in which a designer can quickly create fully valid 3D routes for pipelines, HVAC lines, cable cars, and other swept three-dimensional bodies.

During their design using a project planning system, pipelines are initially generated schematically and two-dimensionally in a piping and instrumentation diagram (P&ID). A three-dimensional design of the pipeline is then created. Components and branches must be present in both two-dimensional and three-dimensional representations and must be in the same order. In addition, the pipelines in both types of representation must match with respect to their connections or junctions to external devices or pipelines.

SUMMARY OF THE INVENTION

It is an object of the present invention to provide a project planning system, a control program and a method for reliably and rapidly verifying a consistent two-dimensional and three-dimensional recording of pipelines in a project planning system and to specify suitable means for implementing the method.

This and other objects and advantages are achieved in accordance with the invention by a method for checking the consistent recording of pipelines in a project planning system, in which pipelines are recorded two-dimensionally in a first plan and three-dimensionally in a second plan, at least one main path within each plan is determined for pipelines recorded in both plans. Preferably, the main path is determined as a path that does not meet any other path within the respective pipeline as a branch or connection of the other path in the tributary direction. Each branch has exactly one incoming connection in the main flow direction, exactly one outgoing connection in the main flow direction, and at least one incoming or outgoing connection in the tributary direction. Essentially, the main path can be determined by eliminating paths that lead to loops or parallel branches within a pipeline.

For the main paths recorded, in accordance with the invention, sequences of objects within both plans are determined comprising line components, branches and or connections, which are each to be compared with one another. From the sequences to be compared, any objects without a mutual correspondence that are only recorded in one of the two plans or only in one main path of one of the two plans are eliminated. After elimination of the objects without mutual correspondence, within the sequences to be compared, objects with different ordering are iteratively determined and classified, which have a maximum order difference with respect to their ordering within the sequences to be compared. The determination of the objects with different ordering is continued until all objects remaining after classification have no order difference with respect to their ordering within the sequences to be compared. Finally, a correctly ordered assignment between corresponding objects recorded in the first plan and in the second plan is created and displayed on a graphical user interface. This allows inconsistencies between the two plans with respect to ordering, completeness, and connectivity to be displayed so as to derive action instructions for resolving the inconsistencies.

In accordance with a preferred embodiment of the present invention, in addition to the determined main paths which represent first-order main paths, secondary paths disjunct to them are determined. Within the secondary paths, second-order or higher-order main paths are determined, if necessary iteratively, which are treated in the same way as first-order main paths. Such a treatment of the second- or higher-order main paths comprises in particular an determination of sequences of objects that are to be compared with one another, an elimination of objects without mutual correspondence, and an iterative determination and elimination of objects with different ordering within the sequences to be compared. Thus, inconsistencies in secondary paths can also be reliably determined.

The objects containing line components, branches or connections can be identified, for example, via markings, component type, nominal diameter or nominal diameter combination. In addition, a mutual correspondence of the objects from the sequences to be compared can ideally be determined via identifications or markings of the objects. Objects with identical or assigned identifications or markings are linked to one another. Preferably, within the sequences to be compared, after linking of the objects to identical or assigned identifications or markings, among unlinked objects, respective objects of matching object type that are to be linked to one another are iteratively determined, which have a minimum difference measure with respect to their order difference from one another and/or to their distance from neighbors of the same type within the sequences to be compared. The determined objects to be linked to each other are treated as objects with mutual correspondence. In particular, respective objects with matching object type to be linked to one another can be determined, which have a minimum difference measure with respect to their order difference to one another and to their weighted distance from first- and second-degree neighbors of the same type within the sequences to be compared.

In accordance with an advantageous embodiment of the present invention, objects without mutual correspondence that are recorded in a main path of the first or second plan and in a secondary path of the respective other plan are classified as foreign objects, while objects without mutual correspondence that are recorded in only one of the two plans are classified as missing objects. In addition, objects with different ordering are classified as incorrectly ordered objects while the objects remaining after classification of the objects with different ordering are classified as correctly ordered objects. For example, a classification of the objects can be displayed on a graphical user interface as a result of a consistency check between two-dimensionally and three-dimensionally recorded pipelines.

It is also an object of the invention to provide a project planning system in accordance with the invention for performing the method in accordance with the previously disclosed embodiments and which is configured to record pipelines two-dimensionally in a first plan and three-dimensionally in a second plan. In addition, the project planning system is configured to identify at least one main path within each plan for pipelines recorded in both plans, and for each of the main paths recorded within both plans to identify sequences of objects comprising line components, branches or connections that are to be compared with one another. In addition, the project planning system is configured to eliminate from the sequences to be compared objects without mutual correspondence that are only recorded in one of the two plans or only in a main path of one of the two plans.

In addition, the project planning system in accordance with the invention is configured, after elimination of the objects without mutual correspondence within the sequences to be compared, to iteratively determine and classify objects with different ordering that have a maximum order difference with respect to their ordering within the sequences to be compared. Furthermore, the project planning system is configured to continue determination of the objects with different ordering until all objects remaining after classification have no order difference with respect to their ordering within the sequences to be compared, and finally to create a correctly ordered assignment between corresponding objects recorded in the first plan and in the second plan, and display it on a graphical user interface.

It is also an object of the invention to provide a control program in accordance with the invention that can be loaded into a memory of a computer and that comprises at least one code section, upon the execution of which the method in accordance with the disclosed embodiments is executed when the control program is executing on the computer.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The present invention will be described in more detail below by reference to an exemplary embodiment based on the drawing, in which:

FIG. 2 shows a schematic representation of a method sequence for identifying foreign and missing objects within paths to be compared with one another; and FIG. 3 shows a schematic representation of a method sequence for the subsequent determination of incorrectly ordered objects and correctly ordered objects in accordance with the invention.

DETAILED DESCRIPTION OF THE EXEMPLARY EMBODIMENTS

Figure 1:
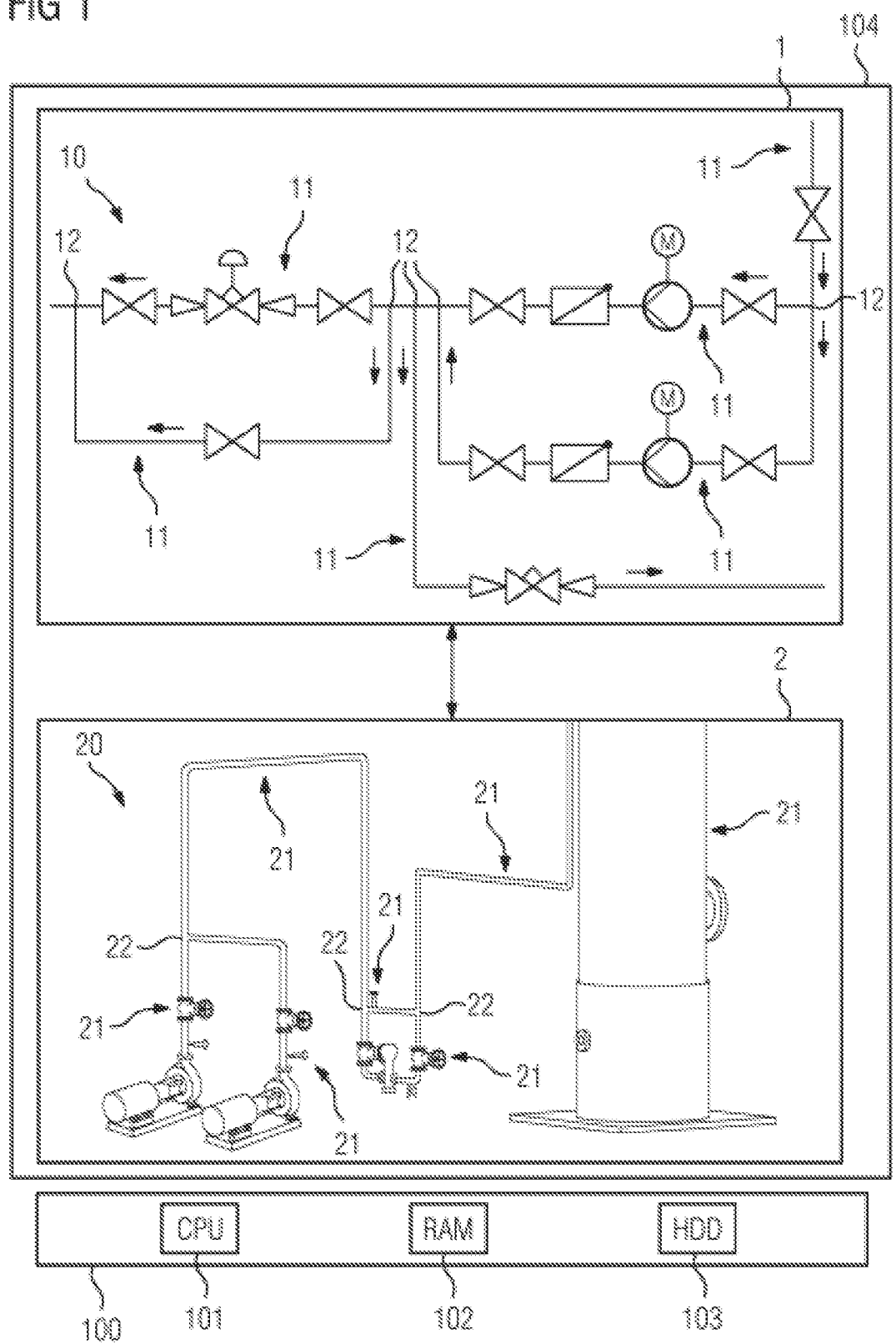
FIG. 1 shows an illustration of a first plan with two-dimensionally recorded pipelines and an associated second plan with three-dimensionally recorded pipelines.

As shown in FIG. 1, in a computer-based project planning system that comprises at least one computer 100 and a control program, pipelines 10, 20 are recorded two-dimensionally in a first plan 1 and three-dimensionally in a second plan 2. The control program is persistently stored in a non-volatile memory 103 of the computer 100 and can be loaded into its working memory 102 and comprises at least one code section, which when processed by a processor 101 of the computer 100 executes the following steps when the control program is running on the computer 100.

For pipelines 10, 20 recorded in both plans 1, 2, in accordance with step 201 of the method sequence described in FIG. 2, at least one main path is determined within each plan 1, 2. In this process, the main path is determined as a path that does not meet any other path within the respective pipeline 10, 20 as a branch or connection of the other path in the tributary direction. Each branch 12, 22 has exactly one incoming connection in the main flow direction, exactly one outgoing connection in the main flow direction, and at least one incoming or outgoing connection in the tributary direction. Essentially, the main path can be determined by eliminating paths that lead to loops or parallel branches within a pipeline 10, 20.

In addition, according to step 202 for the main paths recorded within both plans 1, 2, sequences of objects comprising line components 11, 21, branches 12, 22 and/or connections are determined, which are each to be compared with one another. In this process, the objects containing line components 11, 21, branches 12, 22 or connections are identified preferably via markings, component type, nominal diameter or nominal diameter combination. Then, in step 203, a mutual correspondence of the objects from the sequences to be compared is determined via identifications or markings of the objects. Objects with identical or assigned identifiers or markings are linked together.

From the sequences to be compared, any objects without a mutual correspondence that are only recorded in one of the two plans 1, 2 or only in a main path of one of the two plans are eliminated (step 204). Objects without mutual correspondence that are recorded in a main path of the first 1 or second plan 2 and in a secondary path of the respective other plan are classified as foreign objects. On the other hand, objects that a priori have no mutual correspondence and are only recorded in one of the two plans are classified as missing objects.

After linking the objects with identical or assigned identifications or markings and elimination of the objects according to step 204, within the sequences to be compared, among unlinked objects, respective objects of matching object type that are to be linked to one another are iteratively determined, which have a minimum distance or difference measure with respect to their order difference from one another and/or to their distance from neighbors of the same type within the sequences to be compared. For this purpose, according to step 205 a check is performed to determine whether previously unlinked objects exist. If unlinked objects exist, according to step 206, a check is then performed to determine whether at least one object of the same type or object of identical type is present for a selected object. If at least one object of the same type is present, the object to be linked having the minimum distance or difference measure is determined for the selected object within the sequence to be compared (step 207). The selected object is then linked to the determined object (step 208) and processing returns to step 205. The determined objects to be linked to each other are treated as objects with mutual correspondence.

If there are no more unlinked objects present according to step 205, a transition is made to a determination of correctly ordered objects with mutual correspondence within the sequences to be compared (step 301, see FIG. 3). If there is no object of the same type for the selected object according to step 206, then the selected object is eliminated according to step 209 and classified as a missing object. Processing then returns to step 205.

Preferably, according to steps 205-208, respective objects with matching object type to be linked to one another are determined that have a minimum distance or difference measure with respect to their order difference from one another and to their weighted distance from first- and second-degree neighbors of the same type within the sequences to be compared. For example, the weighting factor for first-degree neighbors can have a value of two, while the weighting factor for second-degree neighbors is set to one.

After elimination of the objects without mutual correspondence within the sequences to be compared, according to FIG. 3, objects with different ordering are iteratively determined and classified that have a maximum order difference with respect to their ordering within the sequences to be compared. The determination of the objects with different ordering is continued until all objects remaining after classification have no order difference with respect to their ordering within the sequences to be compared. To this end, after starting the determination of correctly ordered objects with mutual correspondence (step 301), according to step 302 a check is made as to whether only objects with mutual correspondence are present that have no order difference within the sequences to be compared. If objects with an order difference are present, according to step 303 the objects with mutual correspondence are determined that have a maximum ordering difference with respect to their ordering within the sequences to be compared. According to step 304, these objects are classified as incorrectly ordered objects. Processing then returns to step 302.

If, according to the check in step 302, there are no objects with different ordering present, the objects remaining after classification of the objects with different ordering are classified as correctly ordered objects. Finally, a correctly ordered assignment between corresponding objects recorded in the first plan and the second plan is created (step 305) and displayed on a graphical user interface 104 of the computer (step 306). In addition, the foreign objects, the missing objects or the incorrectly ordered objects with their respective classification can also be displayed selectively on the graphical user interface 104 as the result of a consistency check between two-dimensionally and three-dimensionally recorded pipelines.

In addition to the determined main paths that represent first-order main paths, secondary paths disjunct to them are determined. Within the secondary paths, where necessary, second-order or higher-order main paths are determined, which are treated in the same way as first-order main paths. In particular, a treatment of the second- or higher-order main paths comprises a determination of sequences of objects that are each to be compared with one another, an elimination of objects without mutual correspondence, and an iterative determination and elimination of objects with different ordering within the sequences to be compared.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for checking the consistent recording of pipelines in a project planning system for recording and modeling components of an industrial process automation system, the method comprising:

recording pipelines two-dimensionally in a first plan and three-dimensionally in a second plan into memory of the project planning system;

determining, by a processor of the project planning system, at least one main path within each plan for each of the pipelines recorded in the first and second plans;

determining, by the processor of the project planning system, sequences of objects comprising at least one of (i) line components, (ii) branches and (iii) connections for the main paths recorded within both plans which are each to be compared with one another;

eliminating, by the processor of the project planning system, from sequences to be compared each object without a mutual correspondence which is at least one of (i) only recorded in one of the first and second plans and (ii) only recorded in one main path of one of the first and second plans;

determining and classifying iteratively, by the processor of the project planning system, after elimination of the objects without mutual correspondence, objects with different ordering within the sequences to be compared which have a maximum order difference with respect to their ordering within the sequences to be compared;

continuing, by the processor of the project planning system, determining the objects with different ordering until all objects remaining after classification have no order difference with respect to their ordering within the sequences to be compared;

creating, by the processor of the project planning system, a correctly ordered assignment between corresponding objects recorded in the first plan and second plans; and displaying the correctly ordered assignment between corresponding objects recorded in the first plan and second plans on a graphical user interface; and operating the industrial process automation system based on the correctly ordered assignment between corresponding objects recorded in the first plan and second plans displayed on the graphical user interface.

2. The method as claimed in claim 1, wherein the main path is determined as a path that does not meet any other path within the respective pipeline as at least one of (i) a branch and (ii) connection of another path in a tributary direction; and wherein each branch has exactly one incoming connection in a main direction of flow, exactly one outgoing connection in the main direction of flow, and at least one incoming or outgoing connection in the tributary direction.

3. The method as claimed in claim 1, wherein the main path is determined by eliminating paths leading to at least one of (i) loops and (ii) parallel branches within a pipeline.

4. The method as claimed in claim 2, wherein the main path is determined by eliminating paths leading to at least one of (i) loops and (ii) parallel branches within a pipeline.

5. The method as claimed in claim 1, wherein the objects containing at least one of (i) line components, (ii) branches and (iii) connections are identified via at least one of (i) markings, (ii) component type, (iii) nominal diameter and (iv) nominal diameter combination.

6. The method as claimed in claim 5, wherein a mutual correspondence of the objects from the sequences to be compared is determined via at least one of (i) identifications and (ii) markings of the objects; and wherein objects with at least one of (i) identical or assigned identifications and (ii) markings are linked together.

7. The method as claimed in claim 6, wherein, within the sequences to be compared, after linking of the objects with at least one of (i) identical or assigned identifications and (ii) markings, among unlinked objects, respective objects of matching object type that are to be linked to one another are determined iteratively, which have a minimum difference measure with respect to their order difference from at least one of (i) one another and (ii) their distance from neighbors of the same type within the sequences to be compared; and wherein the determined objects to be linked to one another are treated as objects with mutual correspondence.

8. The method as claimed in claim 7, further comprising:
determining respective objects with matching object type to be linked to one another, said respective objects having a minimum difference measure with respect to their order difference to one another and to their weighted distance from first- and second-degree neighbors of the same type within the sequences to be compared.

9. The method as claimed in claim 1, wherein objects without mutual correspondence which are recorded in a main path of the first or second plan and in a secondary path of the respective other plan are classified as foreign objects; and wherein objects without mutual correspondence which are recorded in only one of the first and second plans are classified as missing objects.

10. The method as claimed in claim 1, wherein objects with different ordering are classified as incorrectly ordered objects; and wherein the objects remaining after classification of the objects with different ordering are classified as correctly ordered objects.

11. The method as claimed in claim 9, wherein a classification of the objects is displayed on a graphical user interface as a result of a consistency check between two-dimensionally and three-dimensionally recorded pipelines.

12. The method as claimed in claim 10, wherein a classification of the objects is displayed on a graphical user interface as a result of a consistency check between two-dimensionally and three-dimensionally recorded pipelines.

13. The method as claimed in claim 1, wherein in addition to the determined main paths, which represent first-order main paths, secondary paths that are disjunct to these are determined; and wherein at least one of (i) second-order and (ii) higher-order main paths, which are treated in the same way as first-order main paths, are determined within the secondary paths.

14. The method as claimed in claim 13, wherein a treatment of at least one of (i) the second- and (ii) higher-order main paths comprises a determination of sequences of objects that are each to be compared with one another, an elimination of objects without mutual correspondence, and an iterative determination and elimination of objects with different ordering within the sequences to be compared.

15. A project planning system for recording and modeling components of an industrial process automation system, comprising:
a processor; and
memory;
wherein the project planning system is configured to:
record pipelines two-dimensionally in a first plan and three- dimensionally in a second plan;
identify at least one main path within each plan for pipelines recorded in first and second plans; identify sequences of objects comprising at least one of (i) line components, (ii) branches and (iii) connections, which are each to be compared with one another for the main paths recorded within both plans;
eliminate from the sequences to be compared objects without a mutual correspondence which are at least one of (i) only recorded in one of the first and second plans and (ii) only recorded in one main path of one of the first and second plans; iteratively identify and classify, within the sequences to be compared, objects with different ordering which have a maximum order difference with respect to their ordering within the sequences to be compared after elimination of the objects without mutual correspondence;
continue determination of the objects with different ordering until all objects remaining after classification have no order difference with respect to their ordering within the sequences to be compared;
create a correctly ordered assignment between corresponding objects recorded in the first plan and second plan; and
display said correctly ordered assignment between corresponding objects recorded in the first plan and second plan on a graphical user interface, wherein the industrial process automation system is operated based on the correctly ordered assignment between corresponding objects recorded in the first plan and second plans displayed on the graphical user interface.

\* \* \* \* \*